United States Patent
Umeda

(10) Patent No.: US 11,421,132 B2
(45) Date of Patent: Aug. 23, 2022

(54) POLISHING COMPOSITION

(71) Applicant: FUJIMI INCORPORATED, Aichi (JP)

(72) Inventor: Takahiro Umeda, Aichi (JP)

(73) Assignee: FUJIMI INCORPORATED

( * ) Notice: Subject to any disclaimer, the term of this patent is extended or adjusted under 35 U.S.C. 154(b) by 0 days.

(21) Appl. No.: 17/199,036

(22) Filed: Mar. 11, 2021

(65) Prior Publication Data

US 2021/0301175 A1    Sep. 30, 2021

(30) Foreign Application Priority Data

Mar. 30, 2020  (JP) .............................. JP2020-061354
Feb. 19, 2021  (JP) .............................. JP2021-024996

(51) Int. Cl.
*C09G 1/02* (2006.01)
*H01L 21/321* (2006.01)

(52) U.S. Cl.
CPC ............ *C09G 1/02* (2013.01); *H01L 21/3212* (2013.01)

(58) Field of Classification Search
None
See application file for complete search history.

(56) References Cited

U.S. PATENT DOCUMENTS

2015/0031205 A1* 1/2015 Mishima .............. C09K 3/1409
  438/693
2015/0259572 A1* 9/2015 Grumbine ................ C23F 1/40
  438/693
2019/0077994 A1* 3/2019 Park .................. H01L 21/31053

FOREIGN PATENT DOCUMENTS

JP  2017061612 A  3/2017

* cited by examiner

*Primary Examiner* — Roberts P Culbert
(74) *Attorney, Agent, or Firm* — Katten Munchin Rosenman LLP

(57) ABSTRACT

To provide a novel polishing composition capable of improving the polishing speed of metal (particularly, tungsten) and maintaining stability as a composition.

A polishing composition contains abrasive grains; quaternary amine having at least one alkyl group having 2 or more carbon atoms or a salt thereof; and a liquid carrier, wherein a pH of the polishing composition is from 2 to 5, and a zeta potential of the abrasive grains in the polishing composition is adjusted to 15 mV or more and less than 40 mV over the entire range of pH 2 to pH 4.

13 Claims, No Drawings

POLISHING COMPOSITION

CROSS-REFERENCE TO RELATED APPLICATION

Background

1. Technical Field

The present invention relates to a polishing composition.

2. Description of Related Arts

In accordance with high integration brought about by miniaturization of a LSI manufacturing process, electronic devices including a computer have achieved high performance such as miniaturization, multi-functionality, and high speed. A chemical mechanical polishing (CMP) method is used in a new microfabrication technology accompanying the high integration of LSI. The CMP method is a technique frequently used in a LSI manufacturing step, particularly in the flattening of an interlayer insulating film, the forming of a metal plug, and the forming of embedded wiring (damascene wiring) in a multilayer wiring forming step.

In this process, the metal (particularly tungsten) excellent in the embedding property is used as a material such as a plug that electrically bonds the wirings to each other in a vertical direction. In the chemical mechanical polishing to form a tungsten plug, a first polishing step for mainly polishing a tungsten layer provided on an insulating film and a second polishing for polishing a tungsten plug, a barrier metal film such as titanium, and an insulating film are carried out in order.

Regarding the chemical mechanical polishing of such a tungsten layer and a tungsten plug (hereinafter, also referred to as "tungsten film"), a composition for chemical mechanical polishing containing a specific amine compound, a dispersing medium containing water, an abrasive grain such as colloidal silica, and an oxidizing agent has been known (JP 2017-61612 A). JP 2017-61612 A discloses that in order to give the abrasive grains stability under acidic conditions, it is preferable to use a cationically modified colloidal silica in which a cationic group is introduced on a surface of the colloidal silica by using a silane coupling agent such as aminopropyl trimethoxysilane on the surface of the colloidal silica (JP 2017-61612 A, paragraph [0031]). The cationic modification of colloidal silica can be performed by adding the silane coupling agent such as aminopropyl trimethoxysilane to a dispersion liquid in which colloidal silica is dispersed.

SUMMARY

However, even if the composition for chemical mechanical polishing disclosed in JP 2017-61612 A is used, it cannot be said that the polishing speed of the tungsten film is sufficiently improved. Also, there is a problem in that it does not lead to the improvement of productivity.

On the other hand, it is indispensable to maintain the stability of the composition as a basic physical property required for the polishing composition.

Therefore, the present invention is to provide a novel polishing composition capable of improving the polishing speed of metal (particularly, tungsten) and maintaining stability as a composition.

In order to solve the above problems, the inventors of the present invention have conducted intensive studies. As a result, it has been found that the above problem can be solved by providing a polishing composition that contains abrasive grains, quaternary amine having at least one alkyl group having 2 or more carbon atoms or a salt thereof, and a liquid carrier, in which a pH of the polishing composition is from 2 to 5, and a zeta potential of the abrasive grains in the polishing composition is adjusted to 15 mV or more and less than 40 mV over the entire range of pH 2 to pH 4.

According to the present invention, it is possible to provide a novel polishing composition capable of improving the polishing speed of metal (particularly, tungsten) and maintaining stability as a composition.

DETAILED DESCRIPTION

Hereinafter, the present invention will be described. However, the present invention is not limited to the following embodiments. Unless otherwise specified, measurements of operations, physical properties, and the like are performed under the conditions of room temperature (20° C. to 25° C.)/relative humidity 40% RH to 50% RH. It should also be understood that all combinations of all lower limit and upper limit values disclosed in the present specification are disclosed. In other words, it should be understood that it can be the basis for amendments. It should also be understood that all combinations of embodiments are disclosed in the present specification. In other words, it should be understood that it can be the basis for amendments.

<Polishing Composition>

In one embodiment of the present invention, there is provided a polishing composition that contains abrasive grains, quaternary amine having at least one alkyl group having 2 or more carbon atoms or a salt thereof, and a liquid carrier, in which a pH of the polishing composition is from 2 to 5, and a zeta potential of the abrasive grains in the polishing composition is adjusted to 15 mV or more and less than 40 mV over the entire range of pH 2 to pH 4. According to such an embodiment, it is possible to provide a novel polishing composition capable of improving the polishing speed of metal (particularly, tungsten) and maintaining stability as a composition.

Hereinafter, each component constituting the polishing composition will be described.

[Abrasive Grain]

In one embodiment of the present invention, the polishing composition contains abrasive grains. The abrasive grains have an action of mechanically polishing an object to be polished, and improve the polishing speed of the object to be polished.

In one embodiment of the present invention, the abrasive grains contain inorganic particles, organic particles, and organic-inorganic composite particles. Specific examples of the inorganic particles include metal oxide particles such as silica, alumina, ceria, and titania, silicon nitride particles, silicon carbide particles, and boron nitride particles. Specific examples of the organic particles include polymethyl methacrylate (PMMA) particles. Among these abrasive grains, silica (particularly colloidal silica) is preferable.

In one embodiment of the present invention, an average primary particle size of the abrasive grains is preferably 10 nm or more, more preferably 15 nm or more, still more preferably 20 nm or more, and even more preferably 25 nm or more By having such a lower limit, the polishing speed of the object to be polished can be improved. In one embodiment of the present invention, the average primary particle size of the abrasive grains is preferably 60 nm or less, more preferably 50 nm or less, still more preferably 40 nm or less. By having such an upper limit, the polishing quality of the object to be polished can be improved. In one embodiment of the present invention, the average primary particle size of the abrasive grains may be a value measured by the method described in the examples.

In one embodiment of the present invention, an average secondary particle size of the abrasive grains is preferably 30 nm or more, more preferably 35 nm or more, still more preferably 40 nm or more, even more preferably 45 nm or more, and even still more preferably nm or more. By having such a lower limit, the polishing speed of the object to be polished can be improved. In one embodiment of the present invention, the average secondary particle size of the abrasive grains is preferably 100 nm or less, more preferably 90 nm or less, still more preferably 80 nm or less. By having such an upper limit, the polishing quality of the object to be polished can be improved. In one embodiment of the present invention, the average secondary particle size of the abrasive grains may be a value measured by the method described in the examples.

In one embodiment of the present invention, the lower limit of an average association degree (average secondary particle size/average primary particle size) of the abrasive grains is preferably 1.3 or more, more preferably 1.4 or more, and still more preferably 1.5 or more. By having such a lower limit, it is possible to obtain a certain mechanical polishing action, and there is a technical effect of improving the polishing speed. In one embodiment of the present invention, the upper limit of the average degree of association (average secondary particle size/average primary particle size) of the abrasive grains is preferably 4.0 or less, more preferably 3.5 or less, still more preferably 3.0 or less, even more preferably 2.5 or less, and even still more preferably 2.4 or less. By having such an upper limit, there is a technical effect that sedimentation due to enlargement of particles and defects of the object to be polished can be suppressed.

In one embodiment of the present invention, the content (solid content concentration) of the abrasive grains in the polishing composition is preferably 0.1% by mass or more, more preferably 1% by mass or more, still more preferably 1.5% by mass or more, even more preferably 2% by mass or more, even still more preferably 2.5% by mass or more, even still more preferably 3.0% by mass or more, and even still more preferably 3.5% by mass or more. By having such a lower limit, the polishing speed of the object to be polished can be improved. In one embodiment of the present invention, the content (solid content concentration) of the abrasive grains in the polishing composition is preferably 10% by mass or less, more preferably 9% by mass or less, still more preferably 8% by mass or less, even more preferably 7% by mass or less, even still more preferably 6% by mass or less, and even still more preferably 5% by mass or less. By having such an upper limit, the polishing quality of the object to be polished can be improved.

As described above, regarding chemical mechanical polishing of a tungsten film, JP 2017-61612 A discloses that it is preferable to use a cationically modified colloidal silica in which a cationic group is introduced on a surface of the colloidal silica by using a silane coupling agent. Here, as a method of producing colloidal silica having such a cationic group, as disclosed in JP 2005-162533 A, a method for immobilizing a silane coupling agent having an amino group such as aminoethyl trimethoxysilane, aminopropyl trimethoxysilane, aminoethyl triethoxysilane, aminopropyl triethoxysilane, aminopropyl dimethyl ethoxysilane, aminopropyl methyl diethoxysilane, and aminobutyl triethoxysilane, or a silane coupling agent having a quaternary ammonium group such as N-trimethoxysilyl propyl-N,N,N-trimethyl ammonium on the surface of the abrasive grain has been known. The abrasive grains in one embodiment of the present invention are different from the abrasive grains obtained by immobilizing such a silane coupling agent having an amino group or a silane coupling agent having a quaternary ammonium group on the surface of the abrasive grains.

(The Number of Silanol Groups Exceeds $0/Nm^2$ and $2.5/Nm^2$ or Less)

In one embodiment of the present invention, the number of silanol groups per unit surface area of the abrasive grains is more than $0/nm^2$ and $2.5/nm^2$ or less. According to such an embodiment, the polishing speed of the object to be polished (particularly, tungsten) can be improved.

In one embodiment of the present invention, the number of silanol groups is $2.4/nm^2$ or less, $2.3/nm^2$ or less, $2.2/nm^2$ or less, $2.1/nm^2$ or less, $2.0/nm^2$ or less, $1.9/nm^2$ or less, or, $1.8/nm^2$ or less. By having such an upper limit, the polishing speed of the object to be polished (particularly, tungsten) can be improved. In one embodiment of the present invention, the number of silanol groups is $0.2/nm^2$ or more, $0.4/nm^2$ or more, $0.6/nm^2$ or more, $0.8/nm^2$ or more, $1.0/nm^2$ or more, $1.2/nm^2$ or more, and $1.4/nm^2$ or more. Having such a lower limit has a technical effect of suppressing defects.

Here, in order to reduce the number of silanol groups per unit surface area of the abrasive grains to $2.5/nm^2$ or less, it can be controlled by selecting a method for producing the abrasive grains, for example, heat treatment such as firing is suitably performed. In one embodiment of the present invention, the firing treatment means, for example, holding abrasive grains (for example, silica) for 30 minutes or more in an environment of 120° C. to 200° C. By performing such a heat treatment, the number of silanol groups on the surface of the abrasive grains can be reduced to a desired value such as $2.5/nm^2$ or less. Unless such a special treatment is applied, the number of silanol groups on the surface of the abrasive grains does not become $2.5/nm^2$ or less.

In one embodiment of the present invention, the silanol group density can be calculated by the following method after measuring or calculating each parameter by the following measuring method or calculating method.

C in the following equation uses the total mass of the abrasive grains, and S in the following equation is a BET specific surface area of the abrasive grains. First, 1.50 g of abrasive grains as a solid content are collected in a 200 ml beaker, 100 ml of pure water is added to form a slurry, and then 30 g of sodium chloride is added to dissolve the abrasive grains. Next, 1 N hydrochloric acid is added to adjust the pH of the slurry to about 3.0 to 3.5, and then pure water is added until the slurry becomes 150 ml. This slurry is adjusted to a pH of 4.0 with 0.1 N sodium hydroxide at 25° C. using an automatic titrator (COM-1700, manufactured by Hiranuma Sangyo Co., Ltd.), and the volume V [L] of the 0.1 N sodium hydroxide solution required to raise the pH from 4.0 to 9.0 by pH titration is measured. The silanol group density can be calculated by the following equation.

$$\rho = (c \times V \times N_A \times 10^{-21})/(C \times S) \quad \text{[Equation 1]}$$

In the above equation, $\rho$ represents a silanol group density (pieces/$nm^2$);

c represents a concentration (mol/L) of a sodium hydroxide solution used for titration;

V represents a volume (L) of the sodium hydroxide solution required to raise pH from 4.0 to 9.0;

$N_A$ represents Avogadro constant (pieces/mol);

C represents a total mass (solid content) (g) of the abrasive grains; and

S represents a weighted average value (nm²/g) of a BET specific surface area of the abrasive grains.

(The Number of Silanol Groups is More than 2.5/Nm²)

In one embodiment of the present invention, the number of silanol groups per unit surface area of the abrasive grains is more than 2.5/nm². In one embodiment of the present invention, the number of silanol groups is 3.0/nm² or more, 4.0/nm² or more, or 5.0/nm² or more. Having such a lower limit has a technical effect of suppressing defects. In one embodiment of the present invention, the number of silanol groups is 8.0/nm² or less, 7.0/nm² or less, or 6.0/nm² or less). Having such an upper limit has a technical effect of improving the polishing speed.

[Quaternary Amine Having at Least One Alkyl Group Having 2 or More Carbon Atoms or a Salt Thereof]

In one embodiment of the present invention, the polishing composition contains quaternary amine having at least one alkyl group having 2 or more carbon atoms or a salt thereof. The quaternary amine having at least one alkyl group having 2 or more carbon atoms or a salt thereof may have a function of modifying the surface of the abrasive grains and adjusting a zeta potential on the surface of the abrasive grains. More specifically, the quaternary amine or a salt thereof can adjust the zeta potential of the abrasive grains in the polishing composition to 15 mV or more and less than 40 mV over the entire range of pH of 2 to 4. However, it is not always possible to adjust the zeta potential to 15 mV or more and less than 40 mV over the entire range of pH of 2 to 4 when the polishing composition contains the quaternary amine or a salt thereof.

In addition, from the aspect that it is essential to have at least one alkyl group having 2 or more carbon atoms, even if tetramethylammonium hydroxide is used as the quaternary amine salt, it is not possible to exhibit a desired effect of the present invention. Those skilled in the art can adjust the amount of such quaternary amine or a salt thereof, and by selecting the addition of other components, the zeta potential can be adjusted to 15 mV or more and less than 40 mV over the entire range of pH of 2 to 4

In one embodiment of the present invention, the polishing composition contains quaternary amine having 1, 2, 3, or 4 alkyl groups having 2 or more carbon atoms or a salt thereof. In that case, the quaternary amine or a salt thereof has 3, 2, 1, or 0 methyl groups. In one embodiment of the present invention, it is preferable to use the quaternary amine having 3 or more alkyl groups having 2 or more carbon atoms or a salt thereof.

In one embodiment of the present invention, the quaternary amine or a salt thereof has an alkyl group having 2 or more carbon atoms, an alkyl group having 3 or more carbon atoms, or an alkyl group having 4 or more carbon atoms. In one embodiment of the present invention, the quaternary amine or a salt thereof has an alkyl group having 18 or less carbon atoms, an alkyl group having 16 or less carbon atoms, an alkyl group having 14 or less carbon atoms, an alkyl group having 12 or less carbon atoms, an alkyl group having 10 or less carbon atoms, an alkyl group having 8 or less carbon atoms, an alkyl group having 6 or less carbon atoms, an alkyl group having 4 or less carbon atoms, or an alkyl group having 3 or less carbon atoms. Such an embodiment improves the solubility in a liquid carrier. Above all, it is preferable that the quaternary amine or a salt thereof has an alkyl group having 3 or less carbon atoms in order to efficiently exhibit the desired effect of the present invention.

In one embodiment of the present invention, the alkyl group having 2 to 18 carbon atoms may be a linear group or may have a branched group, and examples thereof include an ethyl group, a propyl group, an isopropyl group, a butyl group, an isobutyl group, a sec-butyl group, a tert-butyl group, a hexyl group, an octyl group, and a dodecyl group. However, from the viewpoint of efficiently exhibiting the desired effect of the present invention, it is preferable to be linear.

In one embodiment of the present invention, examples of the salt include hydroxide ion and halide ion. Examples of the halide ion preferably include chloride ion and bromide ion.

In one embodiment of the present invention, the quaternary amine having at least one alkyl group having 2 or more carbon atoms or a salt thereof is represented by the following formula:

[Chem. 1]

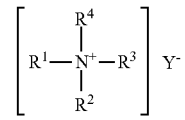

In this case, $R^1$ to $R^4$ are each independently an alkyl group having 2 to 18 carbon atoms, and $Y^-$ is a counter anion. According to such an embodiment, the intended effect of the present invention can be exhibited efficiently.

In such an embodiment, $R^1$ to $R^4$ are each independently an alkyl group having 2 or more carbon atoms, an alkyl group having 3 or more carbon atoms, or an alkyl group having 4 or more carbon atoms. In addition, $R^1$ to $R^4$ are each independently an alkyl group having 18 or less carbon atoms, an alkyl group having 16 or less carbon atoms, an alkyl group having 14 or less carbon atoms, an alkyl group having 12 or less carbon atoms, an alkyl group having 10 or less carbon atoms, an alkyl group having 8 or less carbon atoms, an alkyl group having 6 or less carbon atoms, an alkyl group having 4 or less carbon atoms, or an alkyl group having 3 or less carbon atoms. Such an embodiment improves the solubility in a liquid carrier. In one embodiment of the present invention, the alkyl group has 2 to 4 carbon atoms. Preferably, the alkyl group has 2 or 3 carbon atoms. According to such an embodiment, the desired effect of the present invention can be achieved more efficiently.

In the above embodiment, $Y^-$ can be a hydroxide ion or a halide ion.

In one embodiment of the present invention, the content (active component concentration) of the quaternary amine having at least one alkyl group having or more carbon atoms or a salt thereof in the polishing composition is 0.001% by mass or more, 0.01% by mass or more, 0.03% by mass or more, 0.06% by mass or more, 0.08% by mass or more, 0.1% by mass or more, 0.2% by mass or more, or 0.3% by mass or more. According to such an embodiment, there are technical effects of improving the polishing speed and excellent dispersion stability. In one embodiment of the present invention, the content (active component concentration) of the quaternary amine having at least one alkyl group having or more carbon atoms or a salt thereof in the polishing composition is 5% by mass or less, 3% by mass or less, 1% by mass or less, 0.8% by mass or less, 0.6% by mass or less, 0.4% by mass or less, 0.3% by mass or less, 0.2% by mass or less, 0.15% by mass or less, 0.12% by mass or less, or less than 0.12% by mass. According to such an embodiment, there are technical effects of improving the polishing speed and excellent dispersion stability.

[pH of Polishing Composition]

In one embodiment of the present invention, the pH of the polishing composition is 2 to 5. If the pH of the polishing composition is lower than 2, it is not possible to achieve the desired effect of the present invention. If the pH of the polishing composition is higher than 5, the dispersion stability of silica may be impaired. In one embodiment of the present invention, the pH of the polishing composition may be 2.2 or higher, 2.4 or higher, 2.6 or higher, 2.8 or higher, 3.0 or higher, 3.2 or higher, 3.4 or higher, 3.6 or higher, or 3.8 or higher. In one embodiment of the present invention, the pH of the polishing composition may be 4.8 or lower, 4.6 or lower, 4.4 or lower, 4.2 or lower, 4.0 or lower, 3.8 or lower, 3.4 or lower, 3.2 or lower, 3.0 or lower, 2.9 or lower, 2.8 or lower, 2.7 or lower, or 2.6 or lower. By having such a lower limit, the desired effect of the present invention can be exhibited efficiently. In the present specification, the pH of the polishing composition can be measured according to the method described in examples.

In one embodiment of the present invention, the polishing composition contains a pH adjusting agent. As such a pH adjusting agent, an acid, a base, or a salt thereof can be used.

In one embodiment of the present invention, examples of the base include the above-mentioned quaternary amine having at least one alkyl group having 2 or more carbon atoms or a salt thereof. In one embodiment of the present invention, other compounds may be contained as the base. Examples of such a base include amine such as aliphatic amine and aromatic amine, an ammonium solution, an organic base such as tetraammonium hydroxide, hydroxide of alkali metal such as potassium hydroxide, and hydroxide of Group 2 element, amino acid such as histidine, and ammonia. However, according to one embodiment of the present invention, the base does not contain a base other than the above-mentioned quaternary amine having at least one alkyl group having 2 or more carbon atoms or a salt thereof. According to such an embodiment, it is possible to improve the polishing speed and realize excellent dispersion stability. The term "does not contain" as used in the present specification includes the case where the corresponding component is not contained in the polishing composition at all and is contained in an amount of 0.5 mass ppm or less.

In one embodiment of the present invention, examples of the acid include inorganic acids such as periodic acid, hydrochloric acid, sulfuric acid, nitric acid, phosphoric acid, boric acid, carbonic acid, hypophosphorous acid, phosphoric acid, and phosphoric acid; and organic acids such as formic acid, acetic acid, propionic acid, butyric acid, pentanic acid, 2-methylbutyric acid, caproic acid, 3,3-dimethyl-butyric acid, 2-ethylbutyric acid, 4-methylpentanoic acid, enanthic acid, 2-methylhexanoic acid, octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furancarboxylic acid, 3-furancarboxylic acid, 2-tetracarboxylic acid, methoxyacetic acid, methoxyphenylacetic acid, and phenoxyacetic acid.

In one embodiment of the present invention, the acid has a function of oxidizing metal. Examples of the acid having a function of oxidizing metal include periodic acid, hydrogen peroxide, peracetic acid, percarbonate, urea peroxide, perchloric acid, sodium persulfate, potassium persulfate, and ammonium persulfate. According to such an embodiment, the intended effect of the present invention can be exhibited efficiently. In one embodiment of the present invention, the polishing composition does not contain acid other than acid having a function of oxidizing metal. According to such an embodiment, there is a technical effect that the polishing speed can be improved.

In one embodiment of the present invention, the polishing composition contains one acid and one base.

In one embodiment of the present invention, the acid content (active component concentration) (total content in a case of two or more types) in the polishing composition is 0.001% by mass or more, 0.01% by mass or more, 0.03% by mass or more, 0.06% by mass or more, 0.08% by mass or more, 0.1% by mass or more, 0.2% by mass or more, or 0.3% by mass or more. In one embodiment of the present invention, the acid content (active component concentration) (total content in a case of two or more types) in the polishing composition is 5% by mass or less, 3% by mass or less, 1% by mass or less, 0.8% by mass or less, 0.6% by mass or less, 0.4% by mass or less, 0.3% by mass or less, 0.25% by mass or less, 0.2% by mass or less, or 0.15% by mass or less.

In one embodiment of the present invention, the base content (active component concentration) (total content in a case of two or more types) in the polishing composition is 0.001% by mass or more, 0.01% by mass or more, 0.03% by mass or more, 0.06% by mass or more, 0.08% by mass or more, 0.1% by mass or more, 0.15% by mass or more, 0.2% by mass or more, 0.3% by mass or more, 0.4% by mass or more, 0.5% by mass or more, or 0.6% by mass or more. In one embodiment of the present invention, the base content (active component concentration) (total content in a case of two or more types) in the polishing composition is 5% by mass or less, 3% by mass or less, 1% by mass or less, 0.8% by mass or less, 0.6% by mass or less, 0.4% by mass or less, 0.3% by mass or less, 0.25% by mass or less, 0.2% by mass or less, 0.15% by mass or less, 0.12% by mass or less, or less than 0.12% by mass.

Although the content (active component concentration) of the pH adjusting agent (acid, base) has been described, the above-mentioned content (active component concentration) is not particularly limited, and the polishing composition may be appropriately adjusted so as to have a desired pH within the range of pH 2 to 5.

In one embodiment of the present invention, the polishing composition contains only acid and a base, whether the base is only quaternary amine or a salt thereof having at least one alkyl group having 2 or more carbon atoms or a combination of the quaternary amine or a salt thereof and at least one of the above-mentioned bases, and the pH of the polishing composition is adjusted 2 to 5, 2 to 4.4, 2 to 4, 2 to 3, or 2 or higher and lower than 2.9. With such an embodiment, the desired effect of the present invention can be exhibited efficiently.

[Zeta Potential]

In one embodiment of the present invention, the zeta potential of the abrasive grains in the polishing composition is adjusted to 15 mV or more and less than 40 mV over the entire range of pH 2 to 4. Unless the zeta potential of the abrasive grains in the polishing composition is maintained at 15 mV or more over the entire range of pH 2 to 4, it is not possible to exhibit the desired effect. Similarly, unless the zeta potential of the abrasive grains in the polishing composition is maintained at less than 40 mV over the entire range of pH 2 to 4, it is not possible to exhibit the desired effect.

In one embodiment of the present invention, the zeta potential of the abrasive grains is adjusted to 15 mV or more and less than 40 mV over the entire range of pH 2 to 5. According to such an embodiment, the desired effect can be exhibited over a wider range of pH.

In one embodiment of the present invention, the zeta potential of the abrasive grains is 38 mV or less, 36 mV or less, 34 mV or less, 32 mV or less, 30 mV or less, 28 mV or less, 26 mV or less, 25 mV or less, 24 mV or less, 22 mV or less, less than 22 mV, 21 mV or less, less than 20.7 mV, or 20.5 mV or less. By having such an upper limit, the desired effect of the present invention can be exhibited efficiently.

In one embodiment of the present invention, the zeta potential of the abrasive grains is 16 mV or more, 17 mV or more, 18 mV or more, 19 mV or more, or 20 mV or more. With such an embodiment, the desired effect of the present invention can be exhibited more efficiently.

[Oxidizing Agent]

In one embodiment of the present invention, the polishing composition may contain an oxidizing agent. In one embodiment of the present invention, in a case where the polishing composition does not contain acid having a function of oxidizing metal, an oxidizing agent may be contained.

In one embodiment of the present invention, the oxidizing agent is preferably peroxide. Specific examples of such peroxide are not limited to the following, and examples thereof include hydrogen peroxide, peracetic acid, percarbonate, urea peroxide, sodium persulfate, potassium persulfate, ammonium persulfate, potassium monosulfate, and oxone. The above-mentioned oxidizing agent may be used alone or in combination of two or more types.

In one embodiment of the present invention, the lower limit of the oxidizing agent content (active component concentration) (total content in a case of two or more types) in the polishing composition is 0.001% by mass or more, 0.005% by mass or more, 0.01% by mass or more, 0.1% by mass or more, 0.2% by mass or more, or 0.3% by mass or more. In one embodiment of the present invention, the upper limit of the oxidizing agent content (active component concentration) (total content in a case of two or more types) in the polishing composition is 10% by mass or less, 5% by mass or less, 3% by mass or less, 1% by mass or less, or 0.5% by mass or less.

[Liquid Carrier]

In one embodiment of the invention, the polishing composition contains a liquid carrier. The liquid carrier has a function of dispersing or dissolving each component. More preferably, the liquid carrier is water only. Further, the liquid carrier may be a mixed solvent of water and an organic solvent for dispersion or dissolution of each component.

It is preferable that water does not contain impurities as much as possible from the viewpoint of suppressing the contamination of the object to be polished and the viewpoint of not inhibiting actions of other components. Here, the purity of water can be increased by operations of removal of impurity ions using an ion exchange resin, removal of foreign matters through a filter, distillation, and the like. Specifically, as water, for example, deionized water (ion-exchanged water), pure water, ultrapure water, distilled water, or the like is preferably used.

[Other Additives]

In one embodiment of the present invention, the polishing composition may or may not contain other additives. If contained, it should be noted that the zeta potential of the abrasive grains in the polishing composition is adjusted to 15 mV or more and less than 40 mV over the entire range of pH 2 to pH 4. Specific examples of other additives include a complexing agent, a metal anticorrosive, an antiseptic agent, an antifungal agent, a reducing agent, a water-soluble polymer, an organic solvent for dissolving sparingly soluble organic substances, and the like.

Among the above other additives, a complexing agent, a metal anticorrosive, an antiseptic agent, and an antifungal agent will be described.

(Complexing Agent)

The complexing agent may have an action of chemically etching the surface of the object to be polished, and more effectively improve the polishing speed of the object to be polished by the polishing composition.

Examples of the complexing agent include inorganic acid or a salt thereof, organic acid or a salt thereof, a nitrile compound, amino acid, and a chelating agent. These complexing agents may be used alone or in combination of two or more types. Further, as the complexing agent, a commercially available product or a synthetic product may be used.

As the complexing agent, salts of the inorganic acid or the organic acid may be used. In particular, in a case where a salt of weak acid and a strong base, a salt of strong acid and a weak base, or a salt of weak acid and a weak base is used, a pH buffering action can be expected. Examples of such salts include potassium chloride, sodium sulfate, potassium nitrate, potassium carbonate, potassium tetrafluoroborate, potassium pyrophosphate, potassium oxalate, trisodium citrate, (+)-potassium tartrate, and potassium hexafluorophosphate.

Specific examples of the nitrile compound include acetonitrile, aminoacetonitrile, propionitrile, butyronitrile, isobutyronitrile, benzonitrile, glutaloginitrile, and methoxynitrile.

Specific examples of the amino acid include glycine, α-alanine, β-alanine, N-methylglycine, N,N-dimethylglycine, 2-aminobutyric acid, norvaline, valine, leucine, norleucine, isoleucine, phenylalanine, proline, sarcosin, ornithine, lysine, taurine, serine, threonine, homoserine, tyrosine, bicin, tricine, 3,5-diiodo-tyrosine, β-(3,4-dihydroxyphenyl)-alanine, thyroxine, 4-hydroxy-proline, cysteine, methionine, ethionin, lanthionin, cystationinine, cystine, cysteic acid, aspartic acid, glutamic acid, S-(carboxymethyl)-cysteine, 4-aminobutyric acid, asparagine, glutamine, azaserine, arginine, canabanine, citrulline, δ-hydroxy-lysine, creatine, histidine, 1-methyl-histidine, 3-methyl-histidine, and tryptophan.

Specific examples of the chelating agent include nitrilotriacetic acid, diethylenetriamine pentaacetic acid, ethylenediamine tetraacetic acid, N,N,N-trimethylene phosphonic acid, ethylenediamine-N,N,N',N'-tetramethylene sulfonic acid, transcyclohexane diaminetetraacetic acid, 1,2-diaminopropane tetraacetic acid, glycol ether diaminetetraacetic acid, ethylenediamine orthohydroxyphenyl acetic acid, ethylenediamine disuccinate (SS form), N-(2-carboxylate ethyl)-L-aspartic acid, β-alanindiacetic acid, 2-phosphonobutane-1,2,4-tricarboxylic acid, 1-hydroxyethylidene-1,1-diphosphonic acid, N,N'-bis(2-hydroxybenzyl) ethylenediamine-N,N'-diacetic acid, and 1,2-dihydroxybenzene-4,6-disulfonic acid.

When the polishing composition contains a complexing agent, the content (active component concentration) of the complexing agent is not particularly limited. For example, the lower limit of the content (active component concentration) of the complexing agent is not particularly limited because it is effective even in a small amount, and it is preferably 0.001 g/L or more, more preferably 0.01 g/L or more, and still more preferably 1 g/L or more. In addition, the upper limit of the content (active component concentration) of the complexing agent is preferably 20 g/L or less, more preferably 15 g/L or less, and still more preferably 10 g/L or less. Within such a range, it is advantageous in improving the polishing speed of the object to be polished, and improving the smoothness of the surface of the object to be polished after polishing with the polishing composition.

(Metal Anticorrosive)

The metal anticorrosive acts to prevent deterioration of the surface condition such as surface roughness of the polished surface by preventing the dissolution of the metal.

The metal anticorrosive is a heterocyclic compound or a surfactant. The number of heterocyclic members in the heterocyclic compound is not particularly limited. Further, the heterocyclic compound may be a monocyclic compound or a polycyclic compound having a condensed ring. The metal anticorrosive may be used alone or in combination of two or more types. Further, as the metal anticorrosive, a commercially available product or a synthetic product may be used.

Specific examples of the heterocyclic compound include nitrogen-containing heterocyclic compounds such as a pyrrole compound, a pyrazole compound, an imidazole compound, a triazole compound, a tetrazole compound, a pyridine compound, a pyrazine compound, a pyridazine compound, a pyrindin compound, an indridin compound, an indole compound, an isoindole compound, an indazole compound, a purine compound, a quinolidine compound, a quinoline compound, an isoquinoline compound, a naphthylidine compound, a phthalazine compound, a quinoxalin compound, a quinazoline compound, a cinnoline compound, a buteridine compound, a thiazole compound, an isothiazole compound, an oxazole compound, an isooxazole compound, and a frazane compound.

More specific examples of the pyrazole compound include 1H-pyrazole, 4-nitro-3-pyrazolecarboxylic acid, 3,5-pyrazolecarboxylic acid, 3-amino-5-phenylpyrazole, 5-amino-3-phenylpyrazole, 3,4,5-tribromopyrazole, 3-aminopyrazole, 3,5-dimethylpyrazole, 3,5-dimethyl-1-hydroxymethylpyrazole, 3-methylpyrazole, 1-methyl pyrazole, 3-amino-5-methylpyrazole, 4-amino-pyrazolo [3,4-d] pyrimidine, alloprinol, 4-chloro-1H-pyrazolo [3,4-D] pyrimidin,3,4-dihydroxy-6-Methylpyrazolo (3,4-B)-pyridine, and 6-methyl-1H-pyrazolo [3,4-b] pyridine-3-amine.

Examples of the imidazole compound include imidazole, 1-methylimidazole, 2-methylimidazole, 4-methylimidazole, 1,2-dimethylpyrazole, 2-ethyl-4-methyl imidazole, 2-isopropylimidazole, benzimidazole, 5,6-dimethylbenzimidazole, 2-aminobenzoimidazole, 2-chlorobenzoimidazole, 2-methylbenzimidazole, 2-(1-hydroxyethyl) benzimidazole, 2-hydroxybenzimidazole, 2-phenylbenzimidazole, 2,5-dimethylbenzimidazole, 5-methylbenzimidazole, and 5-nitrobenzimidazole.

Examples of the triazole compound include 1,2,3-triazole (1H-BTA), 1,2,4-triazole, 1-methyl-1,2,4-triazole, methyl-1H-1,2,4-triazole-3-carboxylate, 1,2,4-triazole-3-carboxylic acid, methyl 1,2,4-triazole-3-carboxylate, 1H-1,2,4-triazole-3-thiol, 3,5-diamino-1H-1,2,4-triazole, 3-amino-1,2,4-triazole-5-thiol, 3-amino-1H-1,2,4-triazole, 3-amino-5-benzyl-4H-1,2,4-triazole, 3-amino-5-methyl-4H-1,2,4-triazole, 3-nitro-1,2,4-triazole, 3-bromo-5-nitro-1,2,4-triazole, 4-(1, 2,4-triazole-1-yl) phenol, 4-amino-1,2,4-triazole, 4-amino-3,5-dipropyl-4H-1,2,4-triazole, 4-amino-3,5-dimethyl-4H-1,2,4-triazole, 4-amino-3,5-dipeptyl-4H-1,2,4-triazole, 5-methyl-1,2,4-triazole-3,4-diamine, 1H-benzotriazole, 1-hydroxybenzotriazole, 1-aminobenzotriazole, 1-carboxybenzotriazole, 5-chloro-1H-benzotriazole, 5-Nitro-1H-benzotriazole, 5-carboxy-1H-benzotriazole, 5-Methyl-1H-benzotriazole, 5,6-dimethyl-1H-benzotriazole, 1-(1',2'-dicarboxyethyl) benzotriazole, 1-[N,N-bis (hydroxyethyl) aminomethyl]benzotriazole, 1-[N,N-bis (hydroxyethyl) aminomethyl]-5-methylbenzotriazole, and 1-[N,N-bis (hydroxyethyl) aminomethyl]-4-methylbenzotriazole Examples of the tetrazole compound include 1H-tetrazole, 5-methyltetrazole, 5-aminotetrazole, and 5-phenyltetrazole.

Examples of the indazole compound include 1H-indazole, 5-amino-1H-indazole, 5-nitro-1H-indazole, 5-hydroxy-1H-indazole, 6-amino-1H-indazole, 6-nitro-1H-indazole, 6-hydroxy-1H-indazole, and 3-carboxy-5-methyl-1H-indazole.

Examples of the indole compound include 1H-indole, 1-methyl-1H-indole, 2-methyl-1H-indole, 3-methyl-1H-indole, 4-methyl-1H-indole, 5-methyl-1H-Indole, 6-methyl-1H-indole, 7-methyl-1H-indole, 4-amino-1H-indole, 5-amino-1H-indole, 6-amino-1H-indole, 7-amino-1H-indole, 4-hydroxy-1H-indole, 5-hydroxy-1H-indole, 6-hydroxy-1H-indole, 7-hydroxy-1H-indole, 4-methoxy-1H-indole, 5-methoxy-1H-indole, 6-methoxy-1H-indole, 7-methoxy-1H-indole, 4-chloro-1H-indole, 5-chloro-1H-indole, 6-chloro-1H-indole, 7-chloro-1H-indole, 4-carboxy-1H-indole, 5-carboxy-1H-indole, 6-carboxy-1H-indole, 7-carboxy-1H-indole, 4-nitro-1H-indole, 5-nitro-1H-indole, 6-nitro-1H-Indole, 7-nitro-1H-indole, 4-nitrile-1H-indole, 5-nitrile-1H-indole, 6-nitrile-1H-indole, 7-nitrile-1H-indole, 2,5-dimethyl-1H-indole, 1,2-dimethyl-1H-indole, 1,3-dimethyl-1H-indole, 2,3-dimethyl-1H-indole, 5-amino-2,3-dimethyl-1H-indole, 7-ethyl-1H-indole, 5-(aminomethyl) indole, 2-methyl-5-amino-1H-indole, 3-hydroxymethyl-1H-indole, 6-isopropyl-1H-indole, and 5-chloro-2-methyl-1H-indole.

Further, examples of the surfactant used as a metal anticorrosive include an anionic surfactant, a cationic surfactant, and an amphoteric surfactant.

Examples of the anionic surfactant include polyoxyethylene alkyl ether acetic acid, polyoxyethylene alkyl sulfate ester, alkyl sulfate ester, polyoxyethylene alkyl ether sulfuric acid, alkyl ether sulfuric acid, alkylbenzene sulfonic acid, alkyl phosphate ester, polyoxyethylene alkyl phosphate ester, polyoxyethylene sulfosuccinic acid, alkyl sulfosuccinic acid, alkylnaphthalene sulfonic acid, alkyldiphenyl ether disulfonic acid, and salts thereof.

Examples of the cationic surfactant include an alkyldimethylammonium salt, an alkylbenzyldimethylammonium salt, and an alkylamine salt.

Examples of the amphoteric surfactant include alkyl betaine and alkyl amine oxide.

Specific examples of the nonionic surfactant include polyoxyalkylene alkyl ether such as polyoxyethylene alkyl ether, sorbitan fatty acid ester, glycerin fatty acid ester, polyoxyethylene fatty acid ester, polyoxyethylene alkylamine, and alkyl alkanolamide.

When the polishing composition contains a metal anticorrosive, the content (active component concentration) of the metal anticorrosive is not particularly limited. For example, the lower limit of the content (active component concentration) of the metal anticorrosive is preferably 0.001 g/L or more, more preferably 0.005 g/L or more, and still more preferably 0.01 g/L or more. In addition, the upper limit of the content (active component concentration) of the metal anticorrosive is preferably 10 g/L or less, more preferably 5 g/L or less, and still more preferably 2 g/L or less. Within such a range, it is possible to prevent the deterioration of the surface condition such as surface roughness of the polished surface by preventing the dissolution of the metal.

(Antiseptic Agent and Antifungal Agent)

Further, examples of the antiseptic agent and antifungal agent that may be contained in the polishing composition if necessary include isothiazolin-based antiseptic agent such as 2-methyl-4-isothiazolin-3-one and 5-chloro-2-methyl-4-isothiazolin-3-one, paraoxybenzoic acid esters, and phenoxyethanol. These antiseptic agent and antifungal agent may be used alone or in combination of two or more types.

[Particularly Preferable Combination of Embodiments of Polishing Composition and the Like]

As described above, it should be understood that all combinations of embodiments are disclosed in the present application, and particularly preferable combinations of the embodiments of the polishing composition, and the like will be described below.

That is, according to one embodiment of the present invention, the pH of the polishing composition is 2 to 5, 2 to 4 (4 or less), 2 to 3, or 2 or more and less than 2.9, and the zeta potential of the abrasive grains is adjusted to 15 mV or more and 32 mV or less over the entire range of pH 2 to 4 or pH 2 to 5. According to such an embodiment, the desired effect of the present invention can be exhibited efficiently. Further, in such an embodiment, the zeta potential of the abrasive grains is 25 mV or less, 22 mV or less, less than 22 mV, 21 mV or less, less than 20.7 mV, or 20.5 mV or less. Further, in such an embodiment, the number of silanol groups per unit surface area of the abrasive grains is more than $0/nm^2$ and $2.5/nm^2$ or less. Further, in such an embodiment, the polishing composition contains an acid, and the acid has a function of oxidizing metal. Further, in such an embodiment, the number of carbon atoms of the alkyl group in the quaternary amine or a salt thereof is 3 or less, or 2. According to such an embodiment, the desired effect of the present invention can be remarkably obtained.

In one embodiment of the present invention, the content of metal ions in the polishing composition is less than 0.01 mass ppm. By such an embodiment, the zeta potential can be set in the desired range, and the polishing speed of tungsten can be improved.

In one embodiment of the present invention, the polishing composition does not contain hydrochloric acid. By such an embodiment, the zeta potential can be set in the desired range, and the polishing speed of tungsten can be improved.

In one embodiment of the present invention, the polishing composition does not contain cyclodextrin. By such an embodiment, the zeta potential can be set in the desired range, and the polishing speed of tungsten can be improved.

[Object to be Polished]

In one embodiment of the present invention, tungsten or a tungsten alloy (an alloy having the largest mass ratio of tungsten in the metal constituting the alloy) is suitable as an object to be polished. In one embodiment of the present invention, the object to be polished includes a material selected from the group consisting of silicon nitride, silicon oxide, and polysilicon. Here, examples of the surface containing silicon oxide include a surface containing a silicon oxide film, an HDP film, a USG film, a PSG film, a BPSG film, an RTO film, formed of TEOS as a raw material. Among these, a silicon oxide film formed of TEOS as a raw material is preferable. In particular, the present inventors have confirmed that the polishing speed of the silicon oxide film (particularly, the silicon oxide film formed of TEOS as a raw material) is remarkably improved in a region of the pH of the polishing composition in the range of 3 to 5. It is considered that this is because the electrostatic attraction action works by the surface potentials of silica and silicon oxide which are abrasive grains.

<Method for Producing Polishing Composition>

According to one embodiment of the present invention, the method for producing the polishing composition is not particularly limited. For example, there is provided a method for producing a polishing composition, the method including mixing abrasive grains, quaternary amine having at least one alkyl group having 2 or more carbon atoms or a salt thereof, and a liquid carrier, in which a pH of the polishing composition is from 2 to 5, and a zeta potential of the abrasive grains in the polishing composition is adjusted to 15 mV or more and less than 40 mV over the entire range of pH 2 to pH 4. The temperature at which each component is mixed is not particularly limited, and is preferably from 10° C. to 40° C., and heating may be performed to increase a rate of dissolution. In addition, a mixing time is also not particularly limited.

Adjusting the zeta potential of the abrasive grains in the polishing composition to 15 mV or more and less than 40 mV over the entire range of pH 2 to 4 can be realized by adjusting the amount of the quaternary amine or a salt thereof as described above, and selecting whether or not the addition of other components is necessary or adjusting the amount of addition. As described above, the zeta potential of the abrasive grains is preferably 20 mV or more. An addition of other components may result in the zeta potential of less than 20 mV or may result a decrease of the polishing speed of the object to be polished.

<Polishing Method and Method of Producing Substrate>

In the present invention, there is provided a method for polishing an object to be polished, which includes polishing the object to be polished using the above-mentioned polishing composition. Further, in the present invention, there is provided a method for producing a substrate, which includes polishing the substrate before polishing by using the polishing method. In one embodiment of the present invention, as the substrate, the objects listed in [object to be polished] such as tungsten and silicon oxide (silicon oxide derived from TEOS) are suitable.

In one embodiment of the present invention, the polishing method can be carried out by using a polishing device.

As a polishing apparatus, it is possible to use a general polishing apparatus to which a holder for holding a substrate or the like having an object to be polished and a motor or the like capable of changing the rotation speed are attached, and which includes a platen to which a polishing pad (polishing cloth) can be attached.

As the polishing pad, general non-woven fabric, polyurethane, porous fluororesin and the like can be used without particular limitation. It is preferable that the polishing pad is subjected to groove processing so that a polishing solution is accumulated.

The polishing conditions are not particularly limited. For example, the rotation speed of a platen is preferably 10 to 500 rpm, and the pressure (polishing pressure) applied to the substrate having the object to be polished is preferably 0.5 to 10 psi.

The method for supplying the polishing composition to the polishing pad is not particularly limited, and for example, a method for continuously supplying the composition with a pump or the like is employed. The amount supplied is not particularly limited, the surface of the polishing pad is preferably covered with the polishing composition of the present invention all the time.

After completion of the polishing, the substrate is washed in flowing water, and water droplets adhering to the substrate are removed by a spin dryer or the like to dry the substrate, thereby obtaining a substrate.

The present invention includes the following aspects and embodiments.

1. A polishing composition containing abrasive grains, quaternary amine having at least one alkyl group having 2 or more carbon atoms or a salt thereof, and a liquid carrier, wherein a pH of the polishing composition is from 2 to 5, and a zeta potential of the abrasive grains in the polishing composition is adjusted to 15 mV or more and less than 40 mV over the entire range of pH 2 to pH 4.

2. The polishing composition according to 1., wherein the zeta potential of the abrasive grains is adjusted to 15 mV or more and less than 40 mV over the entire range of pH 2 to 5.

3. The polishing composition according to 1. or 2, wherein the zeta potential of the abrasive grains is adjusted to 32 mV or less.

4. The polishing composition according to any one of 1. to 3., wherein the quaternary amine or the salt thereof has the following formula:

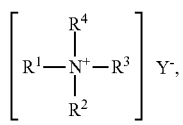

[Chemical 1]

and $R^1$ to $R^4$ are each independently an alkyl group having 2 to 18 carbon atoms, and $Y^-$ is a counter anion.

5. The polishing composition according to 4., wherein the alkyl group has 2 to 4 carbon atoms.

6. The polishing composition according to any one of 1. to 5., wherein the number of silanol groups per unit surface area of the abrasive grains is more than $0/nm^2$ and $2.5/nm^2$ or less.

7. The polishing composition according to any one of 1. to 5., wherein the number of silanol groups per unit surface area of the abrasive grains is more than $2.5/nm^2$.

8. The polishing composition according to 1., wherein the pH of the polishing composition is 4 or less, and the zeta potential of the abrasive grains is adjusted to 15 mV or more and 32 mV or less over the entire range of pH 2 to 4.

9. The polishing composition according to any one of 1. to 8., further containing acid.

10. The polishing composition according to 9., wherein the acid has a function of oxidizing metal.

11. A method for polishing an object to be polished, including polishing an object to be polished using the polishing composition according to any one of 1. to 10.

EXAMPLES

The present invention will be further described in detail using the following examples and comparative examples. Here, the technical scope of the present invention is not limited to the following examples. In addition, unless otherwise specified, "%" and "parts" mean "% by mass" and "parts by mass", respectively. Further, in the following examples, unless otherwise specified, the operation was performed under the conditions of room temperature (25° C.)/relative humidity 40% to 50% RH.

<Preparation of Polishing Composition>

Each polishing composition was prepared by stirring and mixing abrasive grains (an average secondary particle size of colloidal silica having an average primary particle size of 30 nm is 61 nm and an average secondary particle size of colloidal silica having an average primary particle size of 35 nm is 67 nm), acid, a base, an oxidizing agent, and an additive, of the compositions indicated in Table 1, in water (mixing temperature: about 25° C., mixing time: about 10 minutes). In addition, "–" in Table 1 means that the component was not added.

<Average Primary Particle Size of Abrasive Grains>

The average primary particle size of the abrasive grains was calculated from the specific surface area of the abrasive grains measured by a BET method using "Flow Sorb II 2300" manufactured by Micromeritics and the density of the abrasive grains.

<Average Secondary Particle Size of Abrasive Grains>

The average secondary particle size of the abrasive grains was calculated by a dynamic light scattering method measured with "UPA-UT151" available from Microtrac.

<pH of Polishing Composition>

The pH of the polishing composition was determined by calibrating at 3 points using a standard buffer solution (phthalate pH buffer solution, pH: 4.01 (25° C.), neutral phosphate pH buffer solution, pH: 6.86 (25° C.), and carbonate pH buffer solution, pH: 10.01 (25° C.)) with a glass electrode type hydrogen ion concentration indicator (available from Horiba, Ltd., model number: F-23)), then putting a glass electrode to the polishing composition, and measuring a value after the mixture has become stable after more than two minutes.

<Zeta (ζ) Potential of Abrasive Grains>

The polishing composition was put in ELS-Z2 available from Otsuka Electronics Co., Ltd., to perform a measurement at temperature 25° C. using a flow cell by a laser Doppler method (electrophoretic light scattering measurement method). The zeta potential X of the abrasive grains in the polishing composition was calculated by analyzing the obtained data by the Smoluchowski equation.

<W Polishing Speed>

Using the polishing composition, a thickness (film thickness) of an object to be polished before and after polishing was measured by a manual sheet resistor (VR-120, available from Hitachi Kokusai Electric Inc.). The polishing speed (Removal Rate) (A/min) was determined by dividing a difference in the thickness (film thickness) of the object to be polished before and after polishing by the polishing time. A tungsten wafer (size: 32 mm×32 mm) was used as the object to be polished.

(Polishing Conditions)

Polishing machine: Single-sided CMP polishing machine (ENGIS)

Polishing pad: Polyurethane pad (IC1010: Rohm and Haas Electronic Materials)

Pressure: 2.4 psi

Platen (table) rotation speed: 100 rpm

Head (carrier) rotation speed: 100 rpm

Flow rate of polishing composition: 100 ml/min

Dressing: Diamond Disk (in-situ condition).

<Storage Stability>

The polishing composition was stored at 80° C. for 1 week. A state of the polishing composition before and after storage was visually confirmed, and the stability was evaluated according to the following criteria. The results obtained are indicated in Table 1.

(Stability Evaluation Criteria)

Good: There was no change in a state of the polishing composition.

Poor: Sedimentation or aggregation (white turbidity) of abrasive grains contained in the polishing composition occurred.

Specifically, x is considered to be the result of reflecting the aggregation of abrasive grains contained in the polishing composition, and is therefore not preferable from the viewpoint of the stability.

TABLE 1-1

| | Abrasive grain | | | Acid | | Base | | |
|---|---|---|---|---|---|---|---|---|
| | Types | Average primary particle size | (wt %) | Types | (wt %) Active component concentration Conversion | Types | (wt %)Active component concentration Conversion | Additive Types |
| Example 1 | A | 30 nm | 4 | Periodic acid | 0.22 | TEAH | 0.095 | — |
| Example 2 | A | 30 nm | 4 | Periodic acid | 0.22 | TEAH | 0.12 | — |
| Example 3 | A | 30 nm | 4 | Periodic acid | 0.22 | TEAH | 0.13 | — |
| Comparative Example 1 | A | 30 nm | 4 | Periodic acid | 0.22 | TEAH | 0.14 | — |
| Example 4 | A | 30 nm | 4 | Nitric acid | 0.10 | TEAH | 0.08 | — |
| Example 5 | A | 30 nm | 4 | Nitric acid | 0.10 | TEAH | 0.26 | — |
| Example 6 | A | 30 nm | 4 | Nitric acid | 0.10 | TEAH | 0.42 | — |
| Example 7 | A | 30 nm | 4 | Nitric acid | 0.10 | TEAH | 0.46 | — |
| Example 8 | B | 35 nm | 4 | Nitric acid | 0.09 | TEAH | 0.04 | — |
| Example 9 | B | 35 nm | 4 | Nitric acid | 0.09 | TEAH | 0.193 | — |
| Example 10 | B | 35 nm | 4 | Nitric acid | 0.09 | TEAH | 0.196 | — |
| Example 11 | B | 35 nm | 4 | Nitric acid | 0.09 | TEAH | 0.199 | — |
| Comparative Example 2 | B | 35 nm | 4 | Nitric acid | 0.09 | TMAH | 0.03 | — |
| Comparative Example 3 | B | 35 nm | 4 | Nitric acid | 0.09 | TMAH | 0.14 | — |
| Example 12 | B | 35 nm | 4 | Nitric acid | 0.09 | TBAH | 0.09 | — |
| Example 13 | B | 35 nm | 4 | Nitric acid | 0.09 | TBAH | 0.31 | — |
| Example 14 | B | 35 nm | 4 | Nitric acid | 0.09 | TBAH | 0.32 | — |
| Comparative Example 4 | A | 30 nm | 4 | Nitric acid | 0.08 | APTES | 0.033 | — |
| Comparative Example 5 | A | 30 nm | 4 | Nitric acid | 0.04 | APTES | 0.033 | — |
| Comparative Example 6 | A | 30 nm | 4 | Nitric acid | 0.02 | APTES | 0.033 | — |
| Comparative Example 7 | B | 35 nm | 4 | Nitric acid | 0.09 | Ammonia hydroxide | 0.01 | — |
| Comparative Example 8 | B | 35 nm | 4 | Nitric acid | 0.09 | Ammonia hydroxide | 0.03 | — |
| Comparative Example 9 | B | 35 nm | 4 | Nitric acid | 0.09 | Ammonia hydroxide | 0.04 | — |
| Comparative Example 10 | B | 35 nm | 4 | Nitric acid | 0.09 | TMAH | 0.04 | HCl |
| Comparative Example 11 | A | 30 nm | 4 | Nitric acid | 0.10 | Ammonia hydroxide | 0.01 | — |
| Comparative Example 12 | A | 30 nm | 4 | Nitric acid | 0.10 | Ammonia hydroxide | 0.030 | — |
| Comparative Example 13 | A | 30 nm | 4 | Nitric acid | 0.10 | Ammonia hydroxide | 0.033 | — |
| Comparative Example 14 | A | 30 nm | 4 | Nitric acid | 0.10 | Ammonia hydroxide | 0.036 | — |

| | Additive | | Oxidizing agent | | | | |
|---|---|---|---|---|---|---|---|
| | (wt %) Active component concentration Conversion | pH | Types | (wt %) Active component concentration Conversion | $\zeta$ potential [mV] | W polishing speed [Å/min] | Storage stability |
| Example 1 | — | 2.5 | — | — | 20.4 | 909 | Good |
| Example 2 | — | 2.9 | — | — | 22.0 | 449 | Good |
| Example 3 | — | 4.1 | — | — | 20.7 | 392 | Good |
| Comparative Example 1 | — | 5.3 | — | — | 15.4 | 531 | Poor |
| Example 4 | — | 2.0 | $H_2O_2$ | 0.31 | 29.3 | 218 | Good |
| Example 5 | — | 3.0 | $H_2O_2$ | 0.31 | 31.8 | 231 | Good |
| Example 6 | — | 4.0 | $H_2O_2$ | 0.31 | 30.7 | 277 | Good |
| Example 7 | — | 5.0 | $H_2O_2$ | 0.31 | 26.9 | 284 | Good |
| Example 8 | — | 2.0 | $H_2O_2$ | 0.31 | 21.6 | 214 | Good |
| Example 9 | — | 3.0 | $H_2O_2$ | 0.31 | 28.6 | 223 | Good |
| Example 10 | — | 4.0 | $H_2O_2$ | 0.31 | 26.2 | 243 | Good |
| Example 11 | — | 5.0 | $H_2O_2$ | 0.31 | 18.7 | 259 | Good |
| Comparative Example 2 | — | 2.0 | $H_2O_2$ | 0.31 | 6.9 | 155 | Poor |
| Comparative Example 3 | — | 3.0 | $H_2O_2$ | 0.31 | 11.9 | 182 | Poor |
| Example 12 | — | 2.0 | $H_2O_2$ | 0.31 | 20.4 | 225 | Good |
| Example 13 | — | 3.0 | $H_2O_2$ | 0.31 | 23.1 | 240 | Good |
| Example 14 | — | 4.0 | $H_2O_2$ | 0.31 | 22.1 | 251 | Good |
| Comparative Example 4 | — | 2.0 | $H_2O_2$ | 0.31 | 41.5 | 188 | Good |
| Comparative Example 5 | — | 3.0 | $H_2O_2$ | 0.31 | 43.3 | 198 | Good |
| Comparative Example 6 | — | 4.0 | $H_2O_2$ | 0.31 | 44.3 | 192 | Good |
| Comparative Example 7 | — | 2.0 | $H_2O_2$ | 0.31 | 7.8 | 193 | Poor |

TABLE 1-1-continued

| | | | | | | | |
|---|---|---|---|---|---|---|---|
| Comparative Example 8 | — | 3.0 | $H_2O_2$ | 0.31 | 8.1 | 172 | Poor |
| Comparative Example 9 | — | 4.0 | $H_2O_2$ | 0.31 | 4.7 | 143 | Poor |
| Comparative Example 10 | 0.01 | 2.0 | $H_2O_2$ | 0.31 | 12.5 | 163 | Poor |
| Comparative Example 11 | — | 2.0 | $H_2O_2$ | 0.31 | 9.3 | 180 | Poor |
| Comparative Example 12 | — | 3.0 | $H_2O_2$ | 0.31 | 7.6 | 198 | Poor |
| Comparative Example 13 | — | 4.0 | $H_2O_2$ | 0.31 | 5.2 | 245 | Poor |
| Comparative Example 14 | — | 5.0 | $H_2O_2$ | 0.31 | −0.1 | 259 | Poor |

\* Abrasive grain A: Colloidal silica (number of silanol groups: 1.5/nm² average secondary particle size: 61 nm)
\* Abrasive grain B: Colloidal silica (number of silanol groups: 5.7/nm² average secondary particle size: 67 nm)
\* TEAH: Tetraethylammonium hydroxide
\* TMAH: Tetramethylammonium hydroxide
\* TBAH: Tetrabutylammonium hydroxide
\* APTES: (3-amino propyl) triethoxysilane
\* The active component concentration of "periodic acid" is 50%.
\* The active component concentration of "nitric acid" is 70%.
\* The active component concentration of "TEAH" is 35%.
\* The active component concentration of "TMAH" is 25%.
\* The active component concentration of "TBAH" is 40%.
\* The active component concentration of "Ammonia hydroxide" is 29%.
\* The active component concentration of "$H_2O_2$" is 31%.
\* The active component concentration of "HCl" is 0.5 mol/L (=1.82) %.

<Consideration>

The polishing composition of the examples can maintain the stability as a composition and can improve the polishing speed of tungsten. On the other hand, the polishing composition of the comparative examples has poor stability as a composition and/or cannot improve the polishing speed of tungsten.

Here, tungsten has a negative zeta potential in the acidic region. Specifically, it is about −25 mV at pH 2, about −40 mV at pH 3, about −50 mV at pH 4, and about −55 mV at pH 5. According to the common knowledge of those skilled in the art, the zeta potential on the surface of the abrasive grains and the zeta potential on the surface of tungsten have different charges, and the greater the sum of the absolute values of each zeta potential, the greater the attractive force between the abrasive grains and tungsten, and the higher the polishing speed should be. However, as compared to the polishing speed of the polishing composition of the comparative example in which cationically modified colloidal silica having an amino group introduced on the surface of the colloidal silica was used and the zeta potential was 40 mV or more, the polishing speed of the polishing composition of the examples using the colloidal silica whose zeta potential was adjusted to less than 40 mV realized a significantly higher polishing speed.

This result is contrary to the common knowledge of those skilled in the art, in other words, it can be said that the polishing composition of the present invention has an unexpected technical effect.

This application is based on Japanese Patent Application No. 2020-061354 filed on Mar. 30, 2020, the disclosure of which is incorporated herein by reference in entirety thereof.

What is claimed is:

1. A polishing composition comprising:
   abrasive grains;
   quaternary amine having at least one alkyl group having 2 or more carbon atoms or a salt thereof; and
   a liquid carrier,
   wherein a pH of the polishing composition is from 2 to 5,
   a zeta potential of the abrasive grains in the polishing composition that is adjusted to 15 mV or more and less than 40 mV over the entire range of pH 2 to pH 4, and
   wherein the quaternary amine or the salt thereof has the following formula:

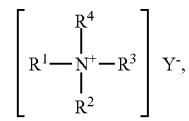

[Chemical 1]

wherein $R^1$ to $R^4$ are each independently selected from an alkyl group having 2 to 18 carbon atoms, and $Y^-$ is a counter anion.

2. The polishing composition according to claim 1, wherein the zeta potential of the abrasive grains is adjusted to 15 mV or more and less than 40 mV over the entire range of pH 2 to 5.

3. The polishing composition according to claim 1, wherein the zeta potential of the abrasive grains is adjusted to 32 mV or less.

4. The polishing composition according to claim 1, wherein $R^1$ to $R^4$ are each independently selected from an alkyl group having 2 to 4 carbon atoms.

5. The polishing composition according to claim 1, wherein the number of silanol groups per unit surface area of the abrasive grains is more than 0/nm² and 2.5/nm² or less.

6. The polishing composition according to claim 1, wherein the number of silanol groups per unit surface area of the abrasive grains is more than 2.5/nm².

7. The polishing composition according to claim 1, wherein the pH of the polishing composition is 4 or less, and the zeta potential of the abrasive grains is adjusted to 15 mV or more and 32 mV or less over the entire range of pH 2 to pH 4.

8. The polishing composition according to claim 1, further comprising acid.

9. The polishing composition according to claim 8, wherein the acid has a function of oxidizing metal.

10. A polishing composition according to claim 1, wherein $R^1$ to $R^4$ are each independently selected from an alkyl group having 2 to 8 carbon atoms.

11. A polishing composition according to claim 1, wherein $R^1$ to $R^4$ are each independently selected from an alkyl group having 2 to 6 carbon atoms.

12. A polishing composition according to claim 1, wherein $R^1$ to $R^4$ are each independently selected from an alkyl group having 2 or 3 carbon atoms.

13. A method for polishing an object to be polished, comprising:

polishing an object to be polished using the polishing composition according to claim 1.

* * * * *